(12) United States Patent
Ranatunga

(10) Patent No.: US 10,659,082 B2
(45) Date of Patent: May 19, 2020

(54) RECEIVING DEVICE AND RECEIVING METHOD

(71) Applicant: SONY CORPORATION, Tokyo (JP)

(72) Inventor: Vijitha Ranatunga, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 79 days.

(21) Appl. No.: 15/323,841

(22) PCT Filed: Jul. 7, 2015

(86) PCT No.: PCT/JP2015/069556
§ 371 (c)(1),
(2) Date: Jan. 4, 2017

(87) PCT Pub. No.: WO2016/009902
PCT Pub. Date: Jan. 21, 2016

(65) Prior Publication Data
US 2017/0149532 A1    May 25, 2017

(30) Foreign Application Priority Data

Jul. 18, 2014 (JP) ................. 2014-147530

(51) Int. Cl.
| | |
|---|---|
| *H03M 13/29* | (2006.01) |
| *G11B 20/18* | (2006.01) |
| *H03M 13/37* | (2006.01) |
| *H04L 1/00* | (2006.01) |

(Continued)

(52) U.S. Cl.
CPC ..... *H03M 13/2909* (2013.01); *H03M 13/293* (2013.01); *H03M 13/373* (2013.01); *H04L 1/0052* (2013.01); *H04L 1/0057* (2013.01); *H04L 1/0058* (2013.01); *G11B 2020/1853* (2013.01); *H03M 13/1515* (2013.01); *H03M 13/6502* (2013.01)

(58) Field of Classification Search
CPC ............ H03M 13/2909; H04L 1/1819; G11B 2020/1853
See application file for complete search history.

(56) References Cited

U.S. PATENT DOCUMENTS 4,336,612 A * 6/1982 Inoue ................. G11B 20/1813
714/755
4,547,882 A * 10/1985 Tanner ................ G06F 11/1076
714/755

(Continued)

FOREIGN PATENT DOCUMENTS

JP 2002-009634 A 1/2002
JP 2007-311924 A 11/2007

(Continued)

*Primary Examiner* — Joseph D Torres
(74) *Attorney, Agent, or Firm* — Chip Law Group

(57) ABSTRACT

There is provided a decoding device including a decoding determination unit that determines a procedure of recovering and decoding missing packets in consideration of a packet missing pattern in data including a set of media packets and redundant packets generated by a two-dimensional XOR-based forward error correction FEC encoding method, and a decoding unit that executes the recovery of the missing packets according to the procedure determined by the decoding determination unit.

7 Claims, 9 Drawing Sheets

(51) Int. Cl.
*H03M 13/15* (2006.01)
*H03M 13/00* (2006.01)

(56) References Cited

U.S. PATENT DOCUMENTS

| | | | | |
|---|---|---|---|---|
| 4,764,927 | A * | 8/1988 | Izumita | H03M 13/29 |
| | | | | 714/761 |
| 5,761,223 | A * | 6/1998 | Ando | H03M 13/35 |
| | | | | 714/774 |
| 6,367,047 | B1 * | 4/2002 | McAuliffe | G11B 20/1833 |
| | | | | 714/755 |
| 6,421,805 | B1 * | 7/2002 | McAuliffe | G06F 11/10 |
| | | | | 714/756 |
| 6,675,318 | B1 * | 1/2004 | Lee | G06F 11/1076 |
| | | | | 714/6.21 |
| 6,978,343 | B1 * | 12/2005 | Ichiriu | G11C 15/00 |
| | | | | 365/49.1 |
| 8,234,547 | B2 * | 7/2012 | Liu | H03M 13/3761 |
| | | | | 714/774 |
| 8,419,547 | B1 * | 4/2013 | Radek | H03M 13/2942 |
| | | | | 370/389 |
| 8,595,606 | B1 * | 11/2013 | Feng | H03M 13/2909 |
| | | | | 714/800 |
| 8,972,815 | B1 * | 3/2015 | Hwee | H03M 13/373 |
| | | | | 714/746 |
| 2002/0122341 | A1 * | 9/2002 | Perner | G11C 29/4401 |
| | | | | 365/200 |
| 2003/0086306 | A1 * | 5/2003 | Takahashi | G06F 11/1008 |
| | | | | 365/200 |
| 2007/0124651 | A1 * | 5/2007 | Champel | H03M 13/2909 |
| | | | | 714/776 |
| 2008/0008167 | A1 * | 1/2008 | Ver Steeg | H04L 1/1819 |
| | | | | 370/389 |
| 2008/0022190 | A1 * | 1/2008 | Ver Steeg | H04L 1/1819 |
| | | | | 714/776 |
| 2008/0028279 | A1 * | 1/2008 | Ver Steeg | H04L 1/1829 |
| | | | | 714/776 |
| 2008/0028280 | A1 * | 1/2008 | Ver Steeg | H04L 1/1819 |
| | | | | 714/776 |
| 2008/0109692 | A1 * | 5/2008 | VerSteeg | H04N 21/4382 |
| | | | | 714/746 |
| 2009/0016228 | A1 * | 1/2009 | Ichiki | H03M 13/2909 |
| | | | | 370/241 |
| 2009/0193314 | A1 * | 7/2009 | Melliar-Smith | |
| | | | | H03M 13/2921 |
| | | | | 714/755 |
| 2010/0050055 | A1 * | 2/2010 | Tanaka | H04L 1/0045 |
| | | | | 714/776 |
| 2010/0251060 | A1 * | 9/2010 | Doi | H03M 13/2906 |
| | | | | 714/752 |
| 2014/0095101 | A1 * | 4/2014 | Gizdarski | G01R 31/31833 |
| | | | | 702/120 |
| 2014/0317475 | A1 * | 10/2014 | Rozenberg | H03M 13/2909 |
| | | | | 714/774 |

FOREIGN PATENT DOCUMENTS

JP  2009-021783 A  1/2009
JP  2010-050809 A  3/2010

* cited by examiner

HORIZONTALLY RECOVERABLE : 1

VERTICALLY RECOVERABLE : 2

FIG.12

| 0 | 1 | 2 | 3 | 4 |
|---|---|---|---|---|
| 5 | 6 | 7 | 8 | 9 |
| 10 | 11 | 12 | 13 | 14 |
| 15 | 16 | 17 | 18 | 19 |
| 20 | 21 | 22 | 23 | |

FIG.13

| 0 | 1 | 2 | 3 | 4 |
|---|---|---|---|---|
| 5 | 6 | 7 | 8 | 9 |
| 10 | 11 | 12 | 13 | 14 |
| 15 | 16 | 17 | 18 | 19 |
| 20 | 21 | 22 | 23 | |

RECEIVING DEVICE AND RECEIVING METHOD

CROSS REFERENCE TO RELATED APPLICATIONS

This application is a U.S. National Phase of International Patent Application No. PCT/JP2015/069556 filed on Jul. 7, 2015, which claims priority benefit of Japanese Patent Application No. JP 2014-147530 filed in the Japan Patent Office on Jul. 18, 2014. Each of the above-referenced applications is hereby incorporated herein by reference in its entirety.

TECHNICAL FIELD

The present disclosure relates to a receiving device, a receiving method, and a computer program.

BACKGROUND ART

In recent years, there has been increased a demand of transmitting multimedia data including video data, audio data, and the like in a short delay via the Internet or another transmission line. For example, there exists a so-called remote operation application in which two remote medical sites are connected via the Internet or the like, an operation state is transmitted in a motion picture from one remote operation room, and a surgical instrument in the remote operation room is operated while the video image is being watched in the other medical site. In this remote operation application, preferably the motion picture is transmitted in a state in which the delay is not longer than several frame intervals.

From the demand like this, for example, Patent Literature 1 proposes a method of performing compression by the wavelet transform using every several lines of each picture in a motion image as one compression encoding block. In this method, without waiting for the input of the whole data of the picture, compression and forward error correction (FEC) processing can be started, and, also when the compression data is transmitted through a network and display is performed on a receiving side, decoding processing can be started before the whole data of the picture is received. Accordingly, in the technique disclosed in Patent Literature 1, real-time motion picture transmission becomes available in the delay not longer than the frame interval if network propagation delay is sufficiently short.

CITATION LIST

Patent Literature

Patent Literature 1: JP 2007-311924A

SUMMARY OF INVENTION

Technical Problem

In the FEC encoding method, the receiving side can perform decoding into original data by receiving a predetermined number of packets in a plurality of packets. In particular, a two-dimensional XOR-based FEC encoding method is used for video transmission. In the two-dimensional XOR-based FEC encoding method, however, recovery processing of a lost packet is heavy, and system cost is increased, and the recovery of the lost packet takes time.

Accordingly, the present disclosure proposes a novel and improved receiving device, receiving method, and computer program capable of exhibiting the maximum recovery performance by the minimum processing in the two-dimensional FEC encoding method.

Solution to Problem

According to the present disclosure, there is provided a decoding device, including: a decoding determination unit configured to determine a procedure of recovering and decoding missing packets in consideration of a packet missing pattern in data including a set of media packets and redundant packets generated by a two-dimensional XOR-based FEC encoding method; and a decoding unit configured to execute the recovery of the missing packets according to the procedure determined by the decoding determination unit.

According to the present disclosure, there is provided a decoding method, including: determining a procedure of recovering and decoding missing packets in consideration of a packet missing pattern in data including a set of media packets and redundant packets generated by a two-dimensional XOR-based FEC encoding method; and executing the recovery of the missing packets according to the determined procedure.

According to the present disclosure, there is provided a computer program causing a computer to execute: determining a procedure of recovering and decoding missing packets in consideration of a packet missing pattern in data including a set of media packets and redundant packets generated by a two-dimensional XOR-based FEC encoding method; and executing the recovery of the missing packets according to the determined procedure.

Advantageous Effects of Invention

According to the present disclosure as explained above, it is possible to provide a novel and improved receiving device, receiving method, computer program capable of exhibiting the maximum recovery performance by the minimum processing in the two-dimensional FEC encoding method.

Note that the effects described above are not necessarily limitative. With or in the place of the above effects, there may be achieved any one of the effects described in this specification or other effects that may be grasped from this specification.

BRIEF DESCRIPTION OF DRAWINGS

FIG. 12 is an explanatory diagram showing recovery processing of missing packets in the receiving device 20 according to the present embodiment.

FIG. 13 is an explanatory diagram showing recovery processing of missing packets in the receiving device 20 according to the present embodiment.

DESCRIPTION OF EMBODIMENT(S)

Figure 1:
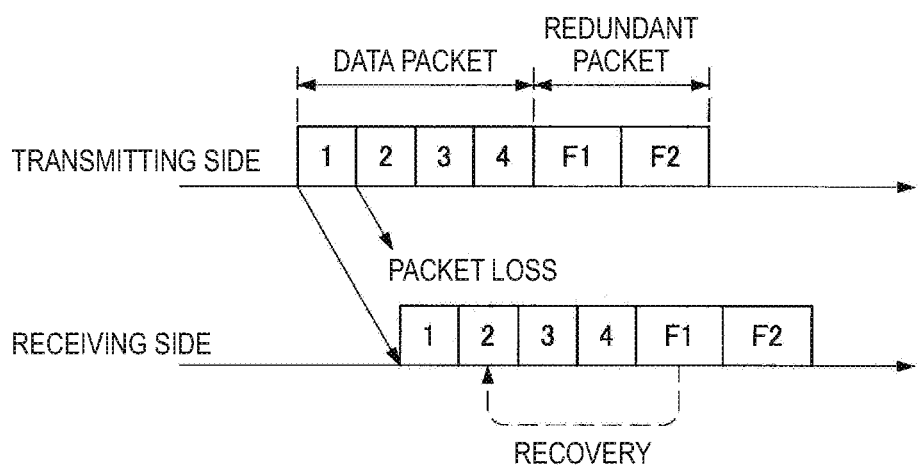
FIG. 1 is an explanatory diagram showing an outline of an FEC method.

Hereinafter, (a) preferred embodiment(s) of the present disclosure will be described in detail with reference to the appended drawings. In this specification and the appended drawings, structural elements that have substantially the same function and structure are denoted with the same reference numerals, and repeated explanation of these structural elements is omitted.

Here, explanation will be performed in the following order.

1. Embodiment of the present disclosure
1.1. Outline of two-dimensional FEC encoding method
1.2. System configuration example
1.3. Functional configuration example
1.4. Operation example
2. Conclusion

1. Embodiment of the Present Disclosure

1.1. Outline of Two-Dimensional FEC Encoding Method

First, there will be explained an outline of a technique for an FEC encoding method to be used in an embodiment of the present disclosure, in particular, a two-dimensional FEC encoding method.

As described above, there has been increased the demand of transmitting multimedia data highly efficiently in a short delay via the Internet or another transmission line. The multimedia data transmitted via a network includes data for a remotely controlled camera, a game machine, and remote medical care, for example.

Stream-type transmission which is one of multimedia data transmission methods needs various techniques. RTP (Real-time Transport Protocol) which is defined in IETF RFC 3550, for example, is mainly used as an Internet technique suitable for the stream-type transmission method.

The RTP does not guarantee data transmission in real time. Since the priority, setting, management, and the like of packet delivery are not included in the transport service provided by the RTP, delivery delay and packet loss could occur in a media RTP packet as in the other packets. Here, the media RTP packet means an RTP packet configuring a content data stream. Even when such delivery delay or packet loss occurs, a receiving side can reproduce the data by using only packets which have arrived within an expected time. This is because video data or audio data can be reproduced to some extent even when some data loss occurs.

Here, a packet with delay delivery or a packet with error is discarded without any processing on the receiving side. That is, there is also a problem that, even when high quality data is delivered, the data is not reproduced sufficiently well on the receiving side because of the packet loss or the error. In particular, under the condition in which it is said that a wired section has error of $10^{-5}$ or more and a wireless section has error of $10^{-3}$ or more, reliability is low if the RTP is utilized as it is, from a point of keeping the quality of media to be delivered.

From such a viewpoint, in the stream-type transmission method, there has been developed a method of performing re-transmission request and re-transmission packet transmission using the TCP which has a high reliability in data transfer. However, since the TCP is robust to error but has a low throughput and a long delay, there is a possibility that the re-transmission packet does not arrive before reproduction time.

Since the RTP/UDP does not guarantee the video quality in the network transmission, the QoS (Quality of Service) control becomes necessary. The QoS technique realizes stable transmission quality and high user sensory quality according to a network situation (packet loss rate or transmission delay). Examples of the QoS technique to improve the data transmission reliability by the use of the RTP include a method such as an automatic re-transmission method, a so-called ARQ (Auto Repeat reQuest) method, and a forward error correction encoding method (so-called FEC method).

The ARQ method detects a lost packet by utilizing the sequence number of a media RTP packet, and requests the re-transmission of the lost packet from a receiving terminal to a transmission terminal. Further, the FEC method uses a plurality of neighboring packets (having continuous sequence numbers) as one FEC block and performs redundant encoding using XOR (eXclusive OR) calculation or using an error correcting code such as the Reed-Solomon (RS) code.

FIG. 1 is an explanatory diagram showing an outline of the FEC method. As shown in FIG. 1, the FEC method generates and transmits one or more redundant packets (packets shown by F1 and F2 in FIG. 1) from a plurality of data packets (packets indicated by 1 to 4 in FIG. 1) on the transmitting side, and, if data packet missing is found on the receiving side (missing of the second packet is found, for example), recovers the data packet using the redundant packets generated on the transmitting side.

The FEC method using the XOR calculation generates a redundant packet by XOR calculation of each bit in the packet. By the generation of the redundant packet by the XOR calculation of each bit in the packet, it becomes possible to recover the loss of up to one packet in an FEC block. Here, the FEC block means a block composed of media RTP packets to be used for the redundant packet generation and a redundant packet.

Figure 2:
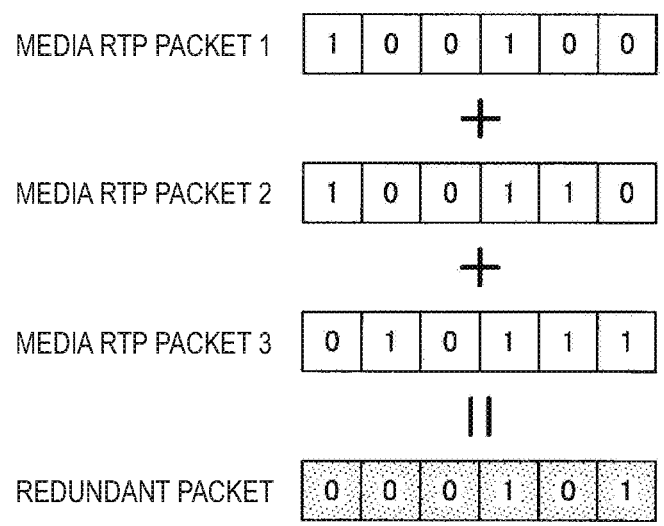
FIG. 2 is an explanatory diagram showing a redundant packet generation method in an XOR-based FEC encoding method.

FIG. 2 is an explanatory diagram showing a redundant packet generation method in the XOR-based FEC encoding method. FIG. 2 shows an example of generating the redundant packet using media RTP packets 1 to 3 each composed of six bits, for simple explanation. As shown in FIG. 2, the redundant packet in the XOR-based FEC encoding method is generated by XOR of each bit in each packet.

Figure 3:
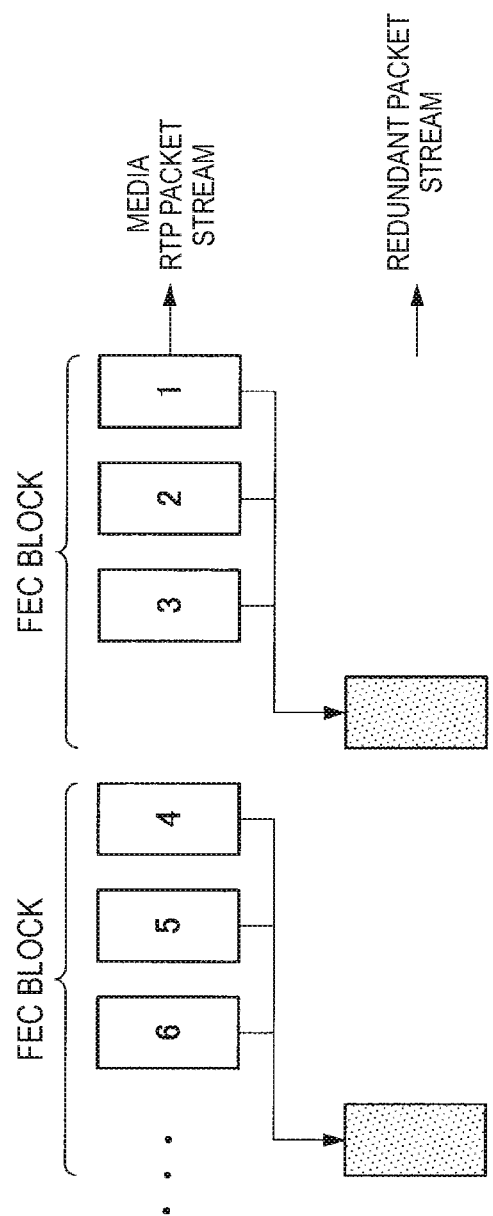
FIG. 3 is an explanatory diagram showing a transmission state of an FEC block including media RTP packets and a redundant packet.

FIG. 3 is an explanatory diagram showing how the FEC block including media RTP packets and a redundant packet is transmitted. FIG. 3 shows how the FEC blocks each including a set of three media RTP packets and a redundant packet generated by the XOR calculation of the three media RTP packets are sequentially transmitted.

The XOR-based FEC encoding method is utilized one-dimensionally and two-dimensionally. The FEC method using the XOR-based FEC encoding method is standardized in SMPTE (Society of Motion Picture and Television Engineers) 2022.

Figure 4:
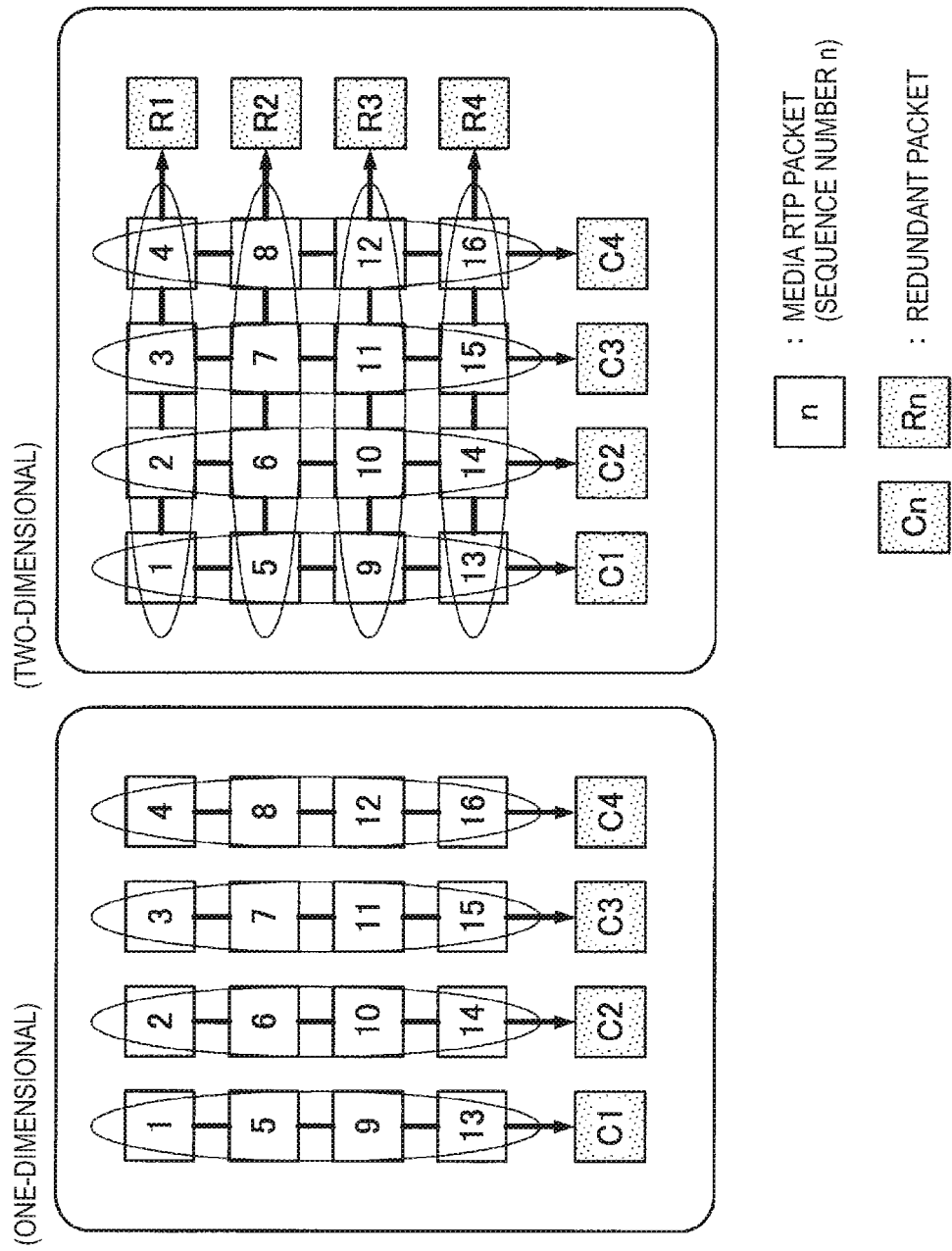
FIG. 4 is an explanatory diagram showing redundant packet generation methods by one-dimensional and two-dimensional XOR-based FEC encoding methods.

FIG. 4 is an explanatory diagram showing redundant packet generation methods by the one-dimensional and two-dimensional XOR-based FEC encoding methods. The redundant packets by the one-dimensional XOR-based FEC encoding method are generated by the XOR calculation only for one direction when a plurality of media RTP packets is arranged in n-rows and m-columns as shown in FIG. 4. In FIG. 4, reference numbers 1 to 16 indicate the RTC packets and reference symbols C1 to C4 indicate the redundant packets.

On the other hand, the redundant packets by the two-dimensional XOR-based FEC encoding method are generated by the XOR calculation for each of the two directions when a plurality of media RTP packets is arranged in n-rows and m-columns as shown in FIG. 4. That is, (n+m) redundant packets are generated by the two-dimensional XOR-based FEC encoding method. In FIG. 4, reference numbers 1 to 16 indicate the media RTC packets, and reference symbols C1 to C4 and R1 to R4 indicate the redundant packets.

The two-dimensional XOR-based FEC encoding method is mainly used for video transmission. Accordingly, in an embodiment of the present disclosure to be explained in the following, the two-dimensional XOR-based FEC encoding method is assumed to be used.

In the XOR-based FEC encoding method, when the packet missing occurs, only one packet is recovered by single recovery processing. In other words, it becomes not possible to perform recovery when error occurs in two or more media RTC packets among a plurality of media RTC packets subjected to the XOR operation.

The receiving side assumes that the media RTP packets are arranged two-dimensionally, and executes the recovery processing using the redundant packets in either one of the vertical direction or the horizontal direction. Then, when it is not possible to recover all the missing packets, next the receiving side executes the recovery processing in the other direction. That is, the receiving side executes the recovery processing first in the vertical direction, and, when it is not possible to recover all the missing packets, next executes the recovery processing in the horizontal direction. Then, the receiving side executes the recovery processing while changing the direction until a recoverable packet does not exist.

Figure 5:
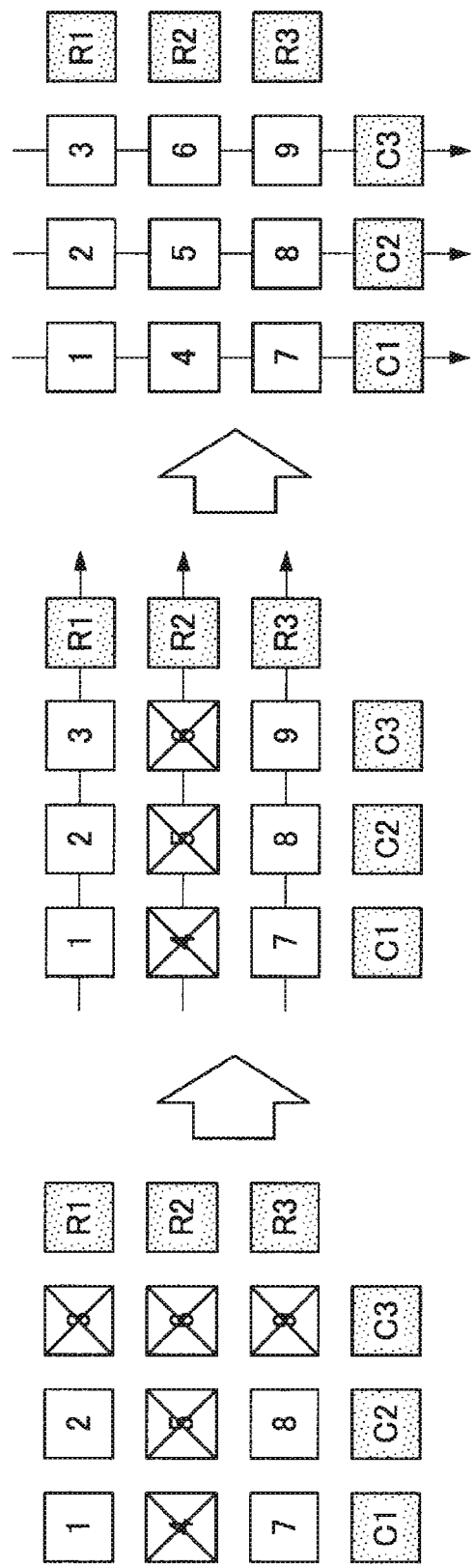
FIG. 5 is an explanatory diagram showing packet recovery by the two-dimensional XOR-based FEC encoding method.

FIG. 5 is an explanatory diagram showing the packet recovery by the two-dimensional XOR-based FEC encoding method. FIG. 5 shows the case of generating the redundant packets in the vertical direction and the horizontal direction from the media RTP packets of three rows and three columns and the media RTP packets of three rows and three columns, for simple explanation.

As shown in the leftmost part of FIG. 5, it is assumed that media RTP packets have arrived at the receiving side while media RTP packets of No. 3, No. 4, No. 5, No. 6, and No. 9 are missing. The receiving side executes the recovery processing using the redundant packets in either one of the vertical direction or the horizontal direction, and, if it is not possible to recover all the missing packets, next executes the recovery processing in the other direction.

In the example shown in FIG. 5, the receiving side first executes the recovery processing using the redundant packets in the horizontal direction to recover the No. 3 and No. 9 packets, and subsequently executes the recovery processing using the redundant packets in the vertical direction to recover the No. 4, No. 5, and No. 6 packets.

In the example shown in FIG. 5, the recovery processing is executed two times in the horizontal direction and the vertical direction and thereby all the missing packets can be recovered. However, it is not possible to know in advance how many times actually the recovery processing is to be executed for perfect recovery. Further, depending on a missing pattern, the missing packets sometimes cannot be recovered perfectly. Specifically, as explained by the use of FIG. 5, when the No. 5 media RTP packet is missing, the No. 5 media RTP packet cannot be recovered if both of the redundant packet C2 in the vertical direction and the redundant packet R2 in the horizontal direction are missing.

In this two-dimensional XOR-based FEC encoding method, the recovery processing of the missing packet is heavy, thereby the system cost becomes high, and the recovery of the missing packet takes time.

Accordingly, the present disclosing party has studied a technique of exhibiting the maximum recovery performance on the receiving side while reducing time taken for the recovery processing on the receiving side in the XOR-based FEC encoding method. Then, as will be explained in the following, the present disclosing party has reached the idea for a technique of exhibiting the maximum recovery performance on the receiving side while reducing time taken for the recovery processing on the receiving side in the XOR-based FEC encoding method by determining a packet missing situation on the receiving side.

The outline of the technique used in an embodiment of the present disclosure has been explained in the above. Subsequently, there will be explained a transmission system configuration example according to an embodiment of the present disclosure.

1.2. System Configuration Example

Figure 6:
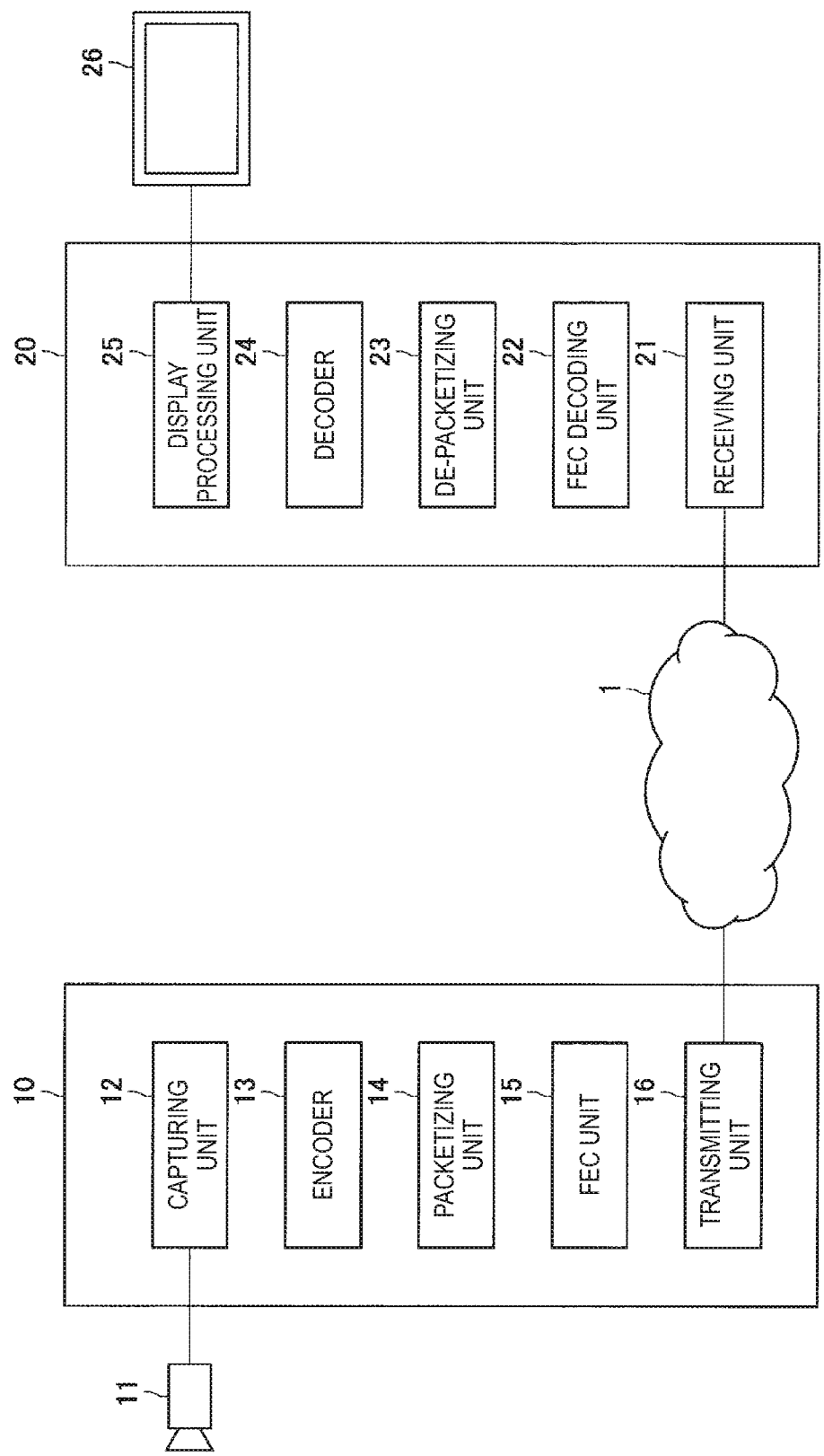
FIG. 6 is an explanatory diagram showing a transmission system configuration example according to an embodiment of the present disclosure.

FIG. 6 is an explanatory diagram showing a transmission system configuration example according to an embodiment of the present disclosure. In the following, there will be explained a transmission system configuration example according to an embodiment of the present disclosure by the use of FIG. 6.

The transmission system according to an embodiment of the present disclosure shown in FIG. 6 includes a transmitting device 10 and a receiving device 20. The transmitting device 10 and the receiving device 20 are connected to a network 1, and can communicate with each other through the network 1.

The transmitting device 10 is configured including, for example, a capturing unit 12 to capture an image acquired by an imaging device 11, an encoder 13 to encode image data captured by the capturing unit 12, a packetizing unit 14 to packetize the image data captured by the capturing unit 12 or data encoded by the encoder 13 into a media RTP packet, an FEC unit 15 to perform forward error correction processing (FEC), and a transmitting unit 16 to transmit the data to the receiving device 20.

The capturing unit 12 captures a video signal sent to the transmitting device 10 in units of line block. When having captured the video signal in units of line block, the capturing unit 12 sends the captured signal to the encoder 13, or sends the captured signal directly to the packetizing unit 14 when the captured signal is not to be encoded.

The encoder 13 encodes the signal captured by the capturing unit 12 in units of line block, by a predetermined method. For example, the encoder 13 may encode the signal in units of line block by a method of performing wavelet transform compression using every several lines of each picture in a motion image as one compression encoding block as disclosed in above Patent Literature 1, but the encoding method of the present disclosure is not limited to such an example. The encoder 13 can encode the signal in units of line block by any encoding method if the encoding method can be applied to the above supposed network system. The encoder 13 sends the encoded data to the packetizing unit 14.

The packetizing unit 14 packetizes the image data captured by the capturing unit 12 or the data encoded by the encoder 13 into a media RTP packet. The media RTP packet is an example of a media packet of the present disclosure. Specifically, the packetizing unit 14 packetizes the data encoded by the encoder 13 into the media RTP packet by adding an RTP header to the encoded data. The packetizing unit 14 sends the generated media RTP packet to the FEC unit 15.

The FEC unit 15 performs FEC-encoding on the media RTP packet generated by the packetizing unit 14. When having performed FEC-encoding on the media RTP packet generated by the packetizing unit 14, the FEC unit 15 sends the encoded data to the transmitting unit 16. In the present embodiment, the FEC unit 15 generates a redundant packet by the above two-dimensional XOR-based FEC encoding method.

According to a preliminarily determined FEC block size (for example, one FEC block is assumed to be configured with four media RTP packets arranged in each of the vertical direction and the horizontal direction), the FEC unit 15 accumulates the media RTP packets generated by the packetizing unit 14 in the amount corresponding to an FEC block size and generates the redundant packets by the XOR method in the vertical direction and the horizontal direction.

The transmitting unit 16 transmits the data encoded by the FEC unit 15 toward the receiving device 20 through the network 1.

The receiving device 20 is configured including a receiving unit 21 to receive the data transmitted from the transmitting device 10 through the network 1, an FEC decoding unit 22 to decode the data encoded by the forward error correction processing, a de-packetizing unit 23 to de-packetize the data decoded by the FEC decoding unit 22, a decoder 24 to decode the data after the de-packetizing in the de-packetizing unit 23, and a display processing unit 25 to output the data after the de-packetizing in the de-packetizing unit 23 or the data after the decoding in the decoder 24 to a display 26. In the present embodiment, if packet missing occurs, the FEC decoding unit 22 recovers the packet using a redundant packet generated by the two-dimensional XOR-based FEC encoding method.

The receiving unit 21 receives the data transmitted from the transmitting device 10 through the network 1. When having received the data transmitted from the transmitting device 10, the receiving unit 21 sends the received data to the FEC decoding unit 22.

The FEC decoding unit 22 performs decoding processing by the FEC method using the data received by the receiving unit 21. The data subjected to the decoding processing by the FEC method in the FEC decoding unit 22 is once returned back to the receiving unit 21, and then sent to the de-packetizing unit 23. The FEC decoding unit 22 arranges the media RTP packets and the redundant packets according to the FEC block size. If a packet is not received, the FEC decoding unit 22 assumes the packet to be a lost packet. The FEC decoding unit 22 performs the lost packet determination on the basis of the sequence number of the packet, for example. The FEC decoding unit 22 may be provided with a buffer having a predetermined capacity and may arrange non-arranged packets according to the sequence number.

Then, if the media RTP packets are missing, the FEC decoding unit 22 executes recovery processing of missing packets using the media RTP packets and the redundant packets. In the present embodiment, since the redundant packet is generated by the two-dimensional XOR-based FEC encoding method, if media RTP packets are missing, the FEC decoding unit 22 performs the XOR operation sequentially on normally received media RTP packets and redundant packets to recover the missing media RTP packets.

The de-packetizing unit 23 executes re-configuration processing of the decoded media RTP packet data. When having re-configured the decoded media RTP packet data, the de-packetizing unit 23 sends the data after the reconfiguration to the decoder 24 (to the display processing unit 25 when the data is not decoded in the transmitting device 10).

The decoder 24 executes decoding processing of the data after the reconfiguration sent from the de-packetizing unit 23. When having decoded the data after the reconfiguration sent from the de-packetizing unit 23, the decoder 24 sends the decoded data to the display processing unit 25.

The display processing unit 25 executes processing of outputting the data after the de-packetizing in the de-packetizing unit 23 or the data after the decoding in the decoder 24 to the display 26. For example, the display processing unit 25 outputs the data after the de-packetizing in the de-packetizing unit 23 or the data after the decoding in the decoder 24 to the display 26 via a video output IF (Video OUT).

The transmission system shown in FIG. 6 performs a series of processing (image capturing, encoding and decoding, FEC processing, and display processing) in the transmitting device 10 and the receiving device 20 in units of picture (field frame). Then, the transmission system shown in FIG. 6 divides one picture into line blocks each grouping every several lines and this series of processing are performed in parallel, and thereby short-delay transmission is realized. Furthermore, the transmitting device 10 may execute pipe-lined processing when performing the processing in units of line block.

Further, in the processing by the FEC decoding unit 22 of the receiving device 20, the present embodiment determines a packet missing situation and executes appropriate recovery processing of missing packets. By determining the packet missing situation and executing the appropriate recovery processing of missing packets, the receiving device 20 can exhibit the maximum recovery performance while reducing the time taken for the recovery processing of missing packets.

Figure 7:
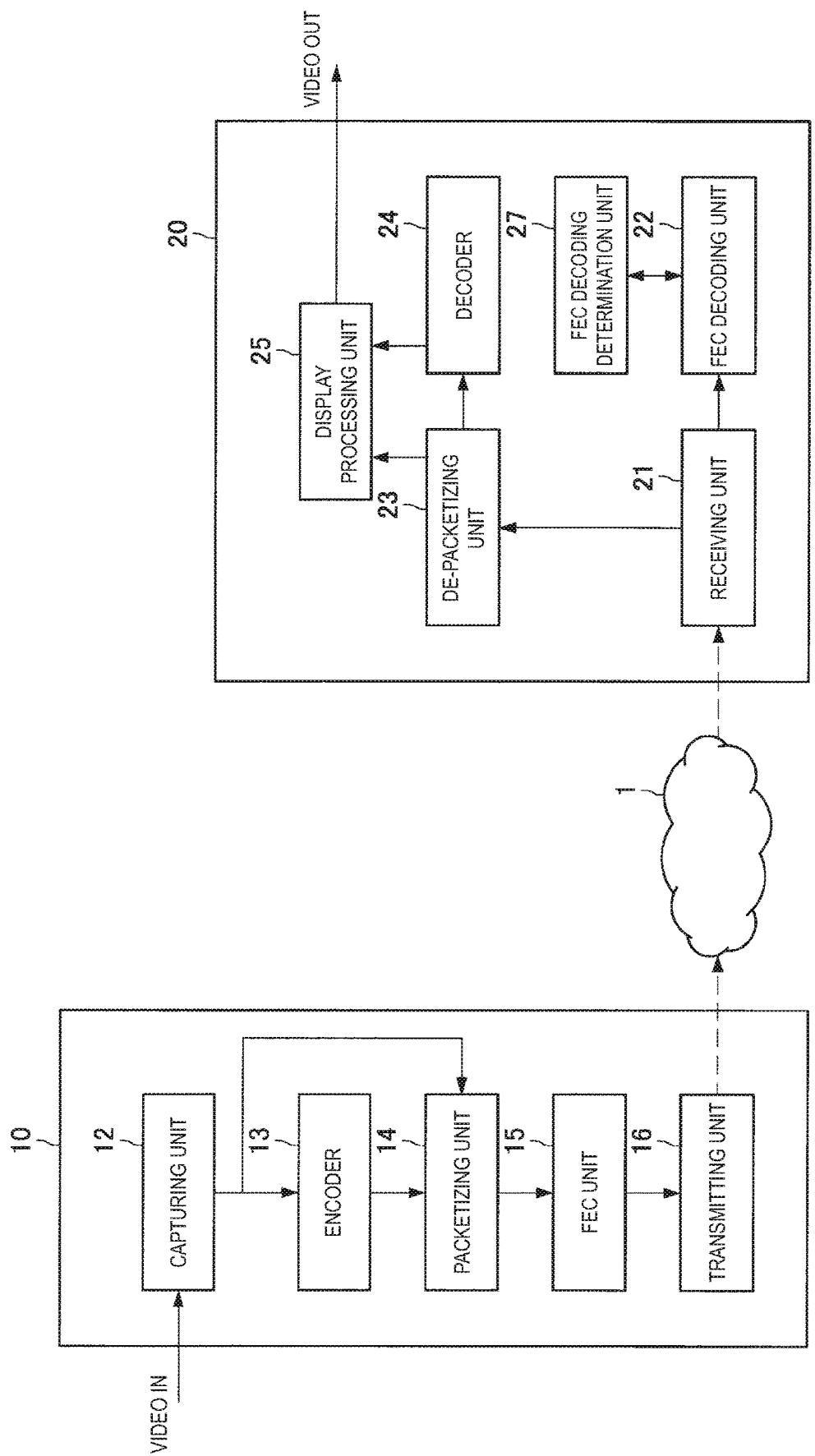
FIG. 7 is an explanatory diagram showing a transmission system configuration example according to an embodiment of the present disclosure.

FIG. 7 is an explanatory diagram showing a detailed configuration example of a transmission system according to an embodiment of the present disclosure. In the following, there will be explained a detailed configuration example of a transmission system according to an embodiment of the present disclosure by the use of FIG. 7.

In a transmission system shown in FIG. 7, an FEC decoding determination unit 27 is added to the receiving device 20 shown in FIG. 6. Accordingly, processing of the FEC decoding determination unit 27 will be explained here.

The FEC decoding determination unit 27 determines the missing situation of packets received by the receiving unit 21 and determines appropriate recovery processing of missing packet. While specific processing in the FEC decoding determination unit 27 will be described below, the FEC decoding determination unit 27 confirms the missing situation by arranging the media RTP packets and the redundant packets two-dimensionally and determines a direction in which the recovery processing is performed first to be a first direction.

Specifically, the FEC decoding determination unit 27 arranges the media RTP packets and the redundant packets two-dimensionally, and compares the number of rows and the number of columns each having one missing packet and determines which is larger. Then, the FEC decoding determination unit 27 determines a procedure of the recovery processing of media RTP packet so as to determine a direction in which the number of missing packets is larger to be the first direction.

The FEC decoding unit 22 executes the recovery processing according to the procedure determined by the FEC decoding determination unit 27. When a missing pattern is taken into consideration in the recovery of missing media RTP packets, the FEC decoding unit 22 first executes recovery processing of the media RTP packet in the first direction, and, if all the missing packets are not recovered, subsequently executes recovery processing of the media RTP packet in a second direction perpendicular to the first direction. That is, the FEC decoding unit 22 executes the recovery processing of media RTP packet two times in the first direction and the second direction. The FEC decoding unit 22 performs the XOR calculation on the normally received media RTP packets and redundant packets as described above as the recovery processing of media RTP packet.

In the receiving device 20 shown in FIG. 7, the FEC decoding determination unit 27 arranges the media RTP packets and the redundant packets two-dimensionally and confirms the missing situation to determine the direction in which the recovery processing is performed first, and thereby the receiving device 20 according to the present embodiment can exhibit the maximum recovery performance while reducing the time taken for the recovery processing of missing packets.

In the above, the detailed configuration example of the transmission system according to an embodiment of the present disclosure has been explained by the use of FIG. 7. Subsequently, an operation example of the receiving device 20 according to an embodiment of the present disclosure will be explained.

1.3. Operation Example

Figure 8:
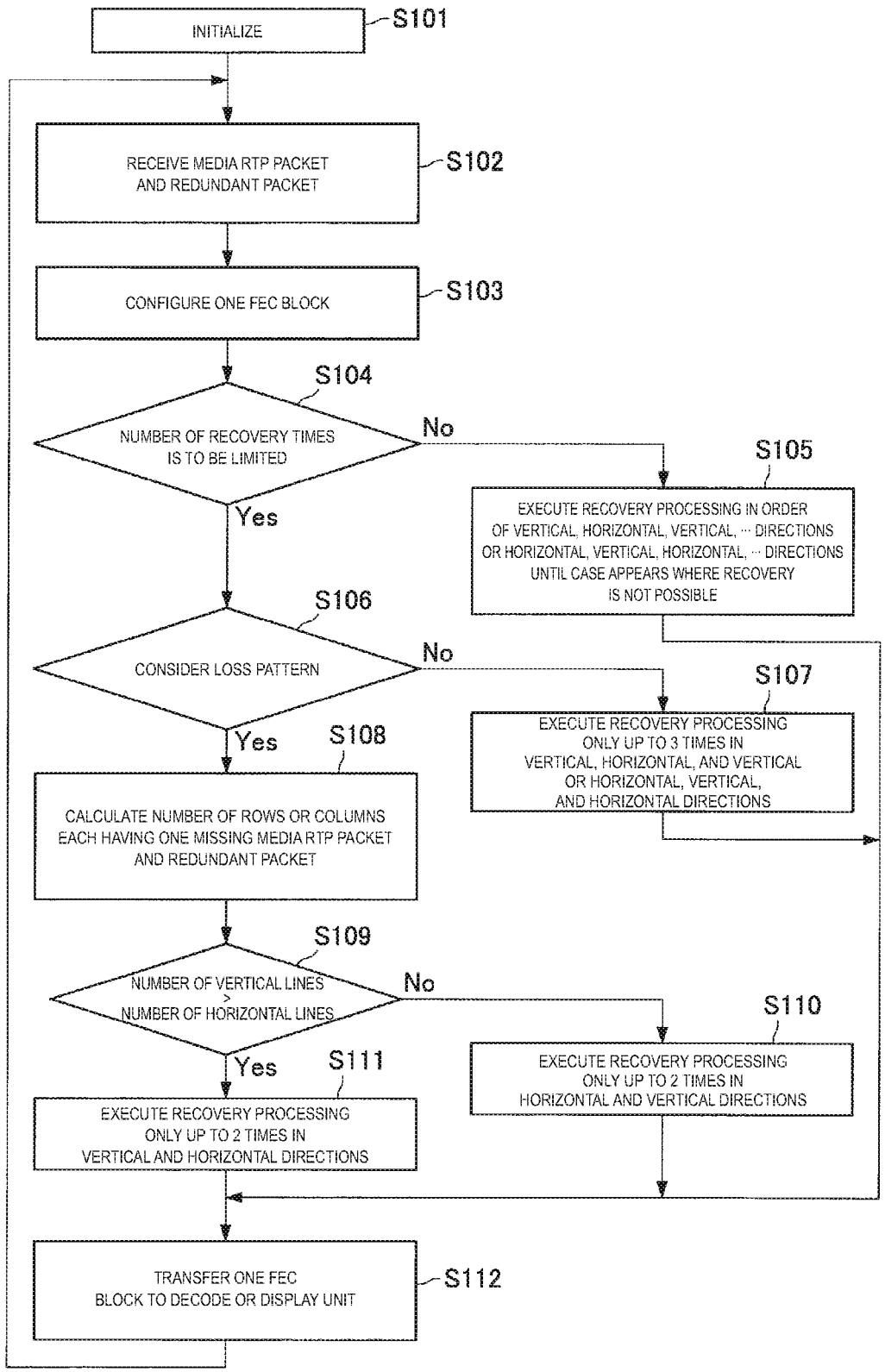
FIG. 8 is a flow chart showing an operation example of a receiving device 20 according to an embodiment of the present disclosure.

FIG. 8 is a flow chart showing an operation example of the receiving device 20 according to an embodiment of the present disclosure. In the following, an operation example of the receiving device 20 according to an embodiment of the present disclosure will be explained by the use of FIG. 8.

When receiving the data from the transmitting device 10, the receiving device 20 executes preliminarily determined initialization processing such as initialization of variables to be used for the processing (step S101). When the initialization processing in step S101 has been completed, subsequently the receiving device 20 receives the media RTP packets and the redundant packets from the transmitting device 10 in the receiving unit 21 (step S102), and configures one FEC block with the received media RTP packets and redundant packets in the FEC decoding unit 22 (step S103).

Subsequently, when missing occurs in the media RTP packets configuring the FEC block, the receiving device 20 determines whether or not to limit the number of times for executing the recovery processing of missing packet (number of recovery times) (step S104). The determination in step S104 is executed by the FEC decoding determination unit 27, for example. In the determination whether or not to limit the number of recovery times, the receiving device 20 refers to preliminarily registered setting whether or not to limit the number of recovery times, for example.

When it is determined that the number of recovery times is not to be limited as the above determination result in step S104 (No in step S104), the receiving device 20 executes the recovery processing while switching the direction each time in the horizontal, vertical, horizontal, . . . directions, or the vertical, horizontal, vertical, . . . directions until the case appears where it is not possible to recover a missing media RTP packet (step S105). The recovery processing in step S105 is executed by the FEC decoding unit 22.

On the other hand, when it is determined that the number of recovery times is to be limited as the above determination result in step S104 (Yes in step S104), the receiving device 20 subsequently determines whether or not to consider the missing pattern in the recovery of the missing media RTP packet (step S106). The determination in step S106 is executed by the FEC decoding determination unit 27, for example. In the determination whether or not to consider the missing pattern in the recovery of the missing packet, the receiving device 20 refers to preliminarily registered setting (setting whether or not to consider the missing pattern), for example.

When it is determined that the missing pattern is not considered in the recovery of the missing media RTP packets as the above determination result in step S106 (No in step S106), the receiving device 20 executes the recovery processing up to total three times in the order of the horizontal, vertical, and horizontal directions, or the vertical, horizontal, and vertical directions as the recovery processing of the missing media RTP packet (step S107). The recovery processing in step S107 is executed by the FEC decoding unit 22.

On the other hand, when it is determined that the missing pattern is considered as the result of the above determination result in step S106 (Yes in step S106), subsequently the receiving device 20 calculates the number of rows or columns each having one missing media RTP packet and redundant packet, for the vertical direction and the horizontal direction in an FEC block where the media RTP packets and the redundant packets are arranged two-dimensionally (step S108). The calculation in step S108 is executed by the FEC decoding determination unit 27, for example.

When having calculated the number of rows or columns each having one missing media RTP packet and redundant packet in above step S108, subsequently the receiving device 20 compares the number of rows and the number of columns each having one missing packet and determines which is larger to determine a direction of a larger number to be a first direction (step S109). The determination in step S109 is executed by the FEC decoding determination unit 27, for example.

When the number of rows each having one missing packet is larger as the above determination result in step S109, as the recovery processing of the lost media RTP packet, the receiving device 20 determines a recovery procedure in which the recovery processing is executed up to total two times in the order of the horizontal direction of the first direction and the vertical direction of the second direction perpendicular to the first direction, and executes the recovery processing according to the determined recovery procedure (step S110).

On the other hand, when the number of columns each having one missing packet is larger as the above determination result in step S109, as the recovery processing of the missing media RTP packet, the receiving device 20 determines a recovery procedure in which the recovery processing is executed up to total two times in the order of the vertical direction of the first direction and the horizontal direction of the second direction perpendicular to the first direction, and executes the recovery processing according to the determined recovery procedure (step S111). The recovery processing in step S110 or step S111 is executed by the FEC decoding unit 22.

Note that, if the number of rows and the number of columns each having one missing packet are the same as the above determination result in step S109, the receiving device 20 may determine a recovery procedure in which any direction is the first direction. That is, while, when the number of rows and the number of columns each having one missing packet are the same as the above determination result in step S109, the receiving device 20 may execute the recovery processing first either in the horizontal direction or in the vertical direction, the recovery processing is assumed to be executed up to total two times also in this case. Obviously, if all the missing packets can be recovered in the first direction, the receiving device 20 needs not perform the recovery processing in the second direction.

FIG. 9 to FIG. 12 are explanatory diagrams to explain the recovery processing of missing packets in the receiving device 20 according to the present embodiment. FIG. 9 to FIG. 12 show an example in which the number of media RTP packets composing one FEC block is 16, the media RTP packets are arranged in four rows by four columns, and the redundant packets are generated by the XOR calculation in each of the rows and each of the columns.

In FIG. 9 to FIG. 12, No. 0 to No. 3, No. 5 to No. 8, No. 10 to No. 13, and No. 15 to No. 18 packets are media RTP packets, No. 4, No. 9, No. 14, and No. 19 packets are redundant packets generated by the XOR operation of the media RTP packets in the horizontal direction, and No. 20 to No. 23 packets are redundant packets generated by the XOR operation of the media RTP packets in the vertical direction.

Figures 9, 10, 11:
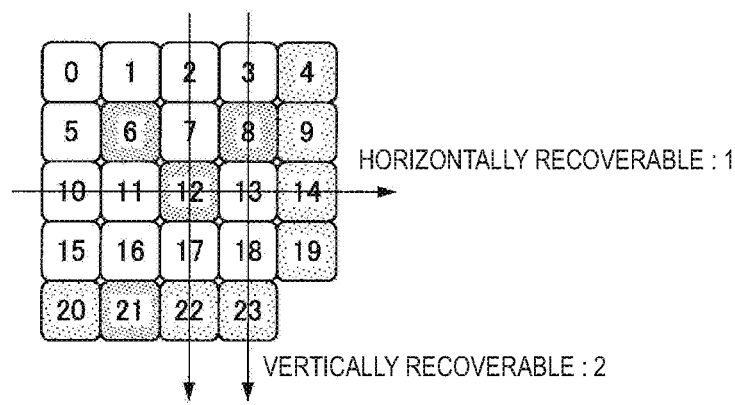
FIG. 9 is an explanatory diagram showing recovery processing of missing packets in the receiving device 20 according to the present embodiment.
FIG. 10 is an explanatory diagram showing recovery processing of missing packets in the receiving device 20 according to the present embodiment.
FIG. 11 is an explanatory diagram showing recovery processing of missing packets in the receiving device 20 according to the present embodiment.

FIG. 9 shows an example of the state in which the media RTP packets and the redundant packets arrive at the receiving device 20. FIG. 9 shows the state in which the No. 6, No. 8, and No. 12 media RTP packets and the No. 21 redundant packet are missing. When the media RTP packets and the redundant packets have arrived in this state, in above step S108, the receiving device 20 calculates the number of rows or columns each having one missing media RTP packet or redundant packet for the vertical direction and the horizontal direction of the FEC block. FIG. 10 shows the state in which the number of rows or columns each having one missing media RTP packet or redundant packet is calculated.

As shown in FIG. 10, in this example, the number of rows each having one missing media RTP packet or redundant packet is one and the number of columns each having one missing packet is two. Accordingly, the receiving device 20 executes the recovery processing up to total two times in the order of the vertical direction and the horizontal direction, as the recovery processing of the missing media RTP packets.

FIG. 11 shows the state of the packet missing after the recovery processing (XOR operation) has been executed in the vertical direction. The receiving device 20 can recover missing of the No. 8 and No. 12 media RTP packets by executing the recovery processing (XOR operation) in the vertical direction. The missing of the No. 8 media RTP packet can be recovered by the XOR operation executed sequentially for the No. 3, No. 13, No. 18, and No. 23 packets. Further, the missing of the No. 12 media RTP packet can be recovered by the XOR operation executed sequentially for the No. 2, No. 7, No. 17, and No. 22 packets.

Then, FIG. 12 shows the state of the packet missing after the recovery processing (XOR operation) has been executed in the horizontal direction after the recovery of the missing of the No. 8 and No. 12 media RTP packets as shown in FIG. 11. By executing the recovery processing in the horizontal direction after executing the recovery processing in the vertical direction, the receiving device 20 can recover missing of the No. 6 media RTP packet. The missing of the No. 6 media RTP packet can be recovered by the XOR operation executed sequentially for the No. 5, No. 7, No. 8, and No. 9 packets. Accordingly, by executing the recovery processing up to total two times in the vertical direction and the horizontal direction, the receiving device 20 can recover missing of all the media RTP packets.

There will be shown a case in which the receiving device 20 is set so as to execute the recovery processing (XOR operation) first in the horizontal direction, for example, without calculating the number of rows or columns each having one missing media RTP packet or redundant packet.

FIG. 13 is an explanatory diagram to explain recovery processing of missing packets in the receiving device 20 according to the present embodiment. In FIG. 13, the No. 0 to No. 3, No. 5 to No. 8, No. 10 to No. 13, and No. 15 to No. 18 packets are media RTP packets, the No. 4, No. 9, No. 14, and No. 19 packets are redundant packets generated by the XOR operation of the respective media RTP packets in the horizontal direction, and the No. 20 to No. 23 packets are redundant packets generated by the XOR operation of the respective media RTP packets in the vertical direction.

When the packets arrive at the receiving device 20 in the state in which the No. 6, No. 8, and No. 12 media RTP packets and the No. 21 redundant packet are missing as shown in FIG. 9, if the recovery processing (XOR operation) is executed first in the horizontal direction, only the No. 12 media RTP packet can be recovered as shown in FIG. 13.

By executing the recovery processing in the vertical direction subsequently after having executed the recovery processing first in the horizontal direction, the receiving device 20 can recover the No. 8 media RTP packet as shown in FIG. 11. Then, by subsequently executing the recovery processing further in the horizontal direction, the receiving device 20 can recover missing of the No. 6 media RTP packet as shown in FIG. 12. Accordingly, the receiving device 20, when set so as to execute the recovery processing first in the horizontal direction, is unable to recover missing of all the media RTP packets without executing the recovery processing up to total three times in the order of horizontal direction, vertical direction and horizontal direction.

That is, by calculating the number of rows or columns each having one missing media RTP packet or redundant packet and executing the recovery processing from a direction having a larger number of missing packets, the receiving device 20 according to an embodiment of the present disclosure can reduce the number of times of the recovery processing compared with the case of executing the recovery processing without calculating the number of rows or columns each having one missing packet.

After having performed the recovery processing in each of above steps S105, S107, S110, and S111, the receiving device 20 transfers one FEC block for which the recovery processing has been executed, to the decoder 24 or the display processing unit 25 (step S112). Then, the receiving device 20 continues the above series of processing as long as data is being transmitted from the transmitting device 10.

The operation example of the receiving device 20 according to an embodiment of the present disclosure has been explained above by the use of FIG. 8. By executing the above series of operations, the receiving device 20 according to an embodiment of the present disclosure executes the recovery processing for the vertical direction and the horizontal direction in the FEC block in which packets are arranged two-dimensionally, from a direction which includes a larger number of rows or columns each having one missing media RTP packet or redundant packet, and thereby can exhibit the maximum recovery performance while reducing the time taken for the recovery processing of the missing packet.

2. Conclusion

As explained above, an embodiment of the present disclosure provides the receiving device 20 which determines the packet missing situation and executes appropriate recovery processing of the missing packet. The receiving device 20 according to an embodiment of the present disclosure, in advance of the recovery processing of missing packets, calculates the number of rows or columns each having one missing media RTP packet or redundant packet for the vertical direction and the horizontal direction of the FEC block in which the packets are arranged two-dimensionally. Then, the receiving device 20 according to an embodiment of the present disclosure executes the recovery processing from a direction including a larger number of missing packets.

By determining the packet missing packets situation and executing the appropriate recovery processing of missing packets, the receiving device 20 according to an embodiment of the present disclosure can exhibit the maximum recovery performance while reducing the time taken for the recovery processing of missing packets.

Steps in processes executed by devices in this specification are not necessarily executed chronologically in the order described in a sequence chart or a flow chart. For example, steps in processes executed by devices may be executed in a different order from the order described in a flow chart or may be executed in parallel.

Further, a computer program can be created which causes hardware such as a CPU, ROM, or RAM, incorporated in each of the devices, to function in a manner similar to that of structures in the above-described devices. Furthermore, it is possible to provide a recording medium having the computer program recorded thereon. Moreover, by configuring respective functional blocks shown in a functional block diagram as hardware or a hardware circuit, the hardware or hardware circuit can achieve a series of processes.

Further, a part of or the whole part of each functional block shown in the functional block diagram used in the above explanation may be realized by a server device connected via a network such as the Internet, for example. In addition, the configuration of each functional bock shown in the functional block diagram used in the above explanation may be realized by a single device or may be realized by a system in which a plurality of devices cooperates with one another. The system in which a plurality of devices cooperates with one another can include a combination of a plurality of server devices, a combination of a server device and a terminal device, and the like, for example.

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

Further, the effects described in this specification are merely illustrative or exemplified effects, and are not limitative. That is, with or in the place of the above effects, the technology according to the present disclosure may achieve other effects that are clear to those skilled in the art based on the description of this specification.

Additionally, the present technology may also be configured as below.

(1)

A decoding device, including:

a decoding determination unit configured to determine a procedure of recovering and decoding missing packets in consideration of a packet missing pattern in data including a set of media packets and redundant packets generated by a two-dimensional XOR-based FEC encoding method; and a decoding unit configured to execute the recovery of the missing packets according to the procedure determined by the decoding determination unit.

(2)

The decoding device according to (1), wherein the decoding determination unit calculates the number of rows and the number of columns each having only one missing packet in the media packets and the redundant packets, and determines a procedure with a direction of a larger number as a first direction.

(3)

The decoding device according to (2), wherein the decoding unit executes recovery of missing packets in the first direction in the procedure determined by the decoding determination unit and recovery of missing packets in a second direction perpendicular to the first direction.

(4)

The decoding device according to (2), wherein the decoding determination unit determines a procedure with any direction as a first direction when the number of rows and the number of columns each having only one missing packet are the same.

(5)

The decoding device according to any of (1) to (4), wherein the redundant packets are generated by performing XOR operation processing on each of the media packets configured in a plurality of rows and columns, for each of the rows and columns.

(6)

A decoding method, including:

determining a procedure of recovering and decoding missing packets in consideration of a packet missing pattern in data including a set of media packets and redundant packets generated by a two-dimensional XOR-based FEC encoding method; and executing the recovery of the missing packets according to the determined procedure.

(7)

A computer program causing a computer to execute:

determining a procedure of recovering and decoding missing packets in consideration of a packet missing pattern in data including a set of media packets and redundant packets generated by a two-dimensional XOR-based FEC encoding method; and executing the recovery of the missing packets according to the determined procedure.

REFERENCE SIGNS LIST 1 network
10 transmitting device
11 imaging device
12 capturing unit
13 encoder
14 packetizing unit
15 FEC unit
16 transmitting unit
20 receiving device
21 receiving unit
22 FEC decoding unit
23 de-packetizing unit
24 decoder
25 display processing unit
26 display
27 FEC decoding determination unit

The invention claimed is:

1. A decoding device, comprising:
a central processing unit (CPU) configured to:
arrange a plurality of media packets of data in a first direction and a second direction, based on a forward error correction (FEC) block size of an FEC block, wherein the FEC block includes at least four media packets of the plurality of media packets in each of the first direction and the second direction;
determine, based on a packet missing pattern, a first recovery process from a plurality of recovery processes for a missing packet in the data, wherein
the data further includes a plurality of redundant packets, and
generation of the plurality of redundant packets is based on a two-dimensional XOR-based FEC encoding process;
calculate a number of rows and a number of columns associated with the plurality of media packets, wherein each row of the calculated number of rows and each column of the calculated number of columns include the missing packet of the data;
compare the calculated number of rows with the calculated number of columns;
execute, based on the comparison, the first recovery process in one of the first direction or the second direction, wherein
the first recovery process is executed in the first direction based on the calculated number of rows that is larger than the calculated number of columns, and
the first recovery process is executed in the second direction based on the calculated number of columns that is larger than the calculated number of rows; and
control a display device to display the data after the execution of the first recovery process.

2. The decoding device according to claim 1, wherein the CPU is further configured to determine, based on the calculation, a second recovery process from the plurality of recovery processes.

3. The decoding device according to claim 2, wherein the CPU is further configured to:
execute, based on the calculation, the first recovery process in the first direction; and
execute the second recovery process in the second direction based on the execution of the first recovery process in the first direction, wherein the second direction is perpendicular to the first direction.

4. The decoding device according to claim 1, wherein the CPU is further configured to determine a direction of execution of the first recovery process as one of the first direction or the second direction based on the calculated number of rows that is same as the calculated number of columns.

5. The decoding device according to claim 1, wherein the plurality of redundant packets is generated based on the two-dimensional XOR-based FEC encoding process on each media packet of the plurality of media packets in a plurality of rows and a plurality of columns.

6. A decoding method, comprising:
arranging a plurality of media packets of data in a first direction and a second direction, based on a forward error correction (FEC) block size of an FEC block, wherein the FEC block includes at least four media packets of the plurality of media packets in each of the first direction and the second direction;
determining, based on a packet missing pattern, a recovery process from a plurality of recovery processes for a missing packet in the data, wherein
the data further includes a plurality of redundant packets, and
generation of the plurality of redundant packets is based on a two-dimensional XOR-based FEC encoding process;
calculating a number of rows and a number of columns associated with the plurality of media packets, wherein each row of the calculated number of rows and each column of the calculated number of columns include the missing packet of the data;
comparing the calculated number of rows with the calculated number of columns;
executing, based on the comparison, the recovery process in one of the first direction or the second direction, wherein
the first recovery process is executed in the first direction based on the calculated number of rows that is larger than the calculated number of columns, and
the first recovery process is executed in the second direction based on the calculated number of columns that is larger than the calculated number of rows; and
controlling a display device to display the data after the execution of the recovery process.

7. A non-transitory computer-readable medium having stored thereon computer-executable instructions that, when executed by a processor, cause the processor to execute operations, the operations comprising:
- arranging a plurality of media packets of data in a first direction and a second direction, based on a forward error correction (FEC) block size of an FEC block, wherein the FEC block includes at least four media packets of the plurality of media packets in each of the first direction and the second direction;
- determining, based on a packet missing pattern, a recovery process from a plurality of recovery processes for a missing packet in the data, wherein
  - the data further includes a plurality of redundant packets, and
  - generation of the plurality of redundant packets is based on a two-dimensional XOR-based FEC encoding process;
- calculating a number of rows and a number of columns associated with the plurality of media packets, wherein each row of the calculated number of rows and each column of the calculated number of columns include the missing packet of the data;
- comparing the calculated number of rows with the calculated number of columns;
- executing, based on the comparison, the recovery process in one of the first direction or the second direction, wherein
  - the first recovery process is executed in the first direction based on the calculated number of rows that is larger than the calculated number of columns, and
  - the first recovery process is executed in the second direction based on the calculated number of columns that is larger than the calculated number of rows; and
- controlling a display device to display of the data after the execution of the recovery process.

* * * * *